United States Patent [19]

Matsuo et al.

[11] Patent Number: 4,858,911
[45] Date of Patent: Aug. 22, 1989

[54] APPARATUS FOR CONVEYING BASE

[75] Inventors: Takao Matsuo, Hyogo; Shigeo Sumi, Saitama, both of Japan

[73] Assignee: Somar Corporation, Tokyo, Japan

[21] Appl. No.: 325,113

[22] Filed: Mar. 20, 1989

Related U.S. Application Data

[63] Continuation of Ser. No. 921,513, Oct. 22, 1986, abandoned.

[30] Foreign Application Priority Data

Oct. 22, 1985 [JP] Japan ............................ 60-236860
Oct. 22, 1985 [JP] Japan ............................ 60-236861

[51] Int. Cl.$^4$ .......................... B65H 9/06; B32B 31/00
[52] U.S. Cl. .................................... 271/240; 271/227; 271/254; 271/255; 271/261; 271/272; 156/364; 156/555
[58] Field of Search ............... 156/351, 364, 555, 559, 156/566, 581, 583.1; 271/261, 227, 240, 253, 254, 255, 272

[56] References Cited

U.S. PATENT DOCUMENTS

| | | | |
|---|---|---|---|
| 3,897,945 | 8/1975 | Faltot | 156/351 |
| 4,214,936 | 7/1980 | Del Bianco | 156/351 |
| 4,377,434 | 3/1983 | Del Bianco | 156/364 |
| 4,657,239 | 4/1987 | Ikesue | 271/227 |

Primary Examiner—George F. Lesmes
Assistant Examiner—J. Davis
Attorney, Agent, or Firm—Sughrue, Mion, Zinn, Macpeak & Seas

[57] ABSTRACT

An apparatus for conveying a base is disclosed which comprises a crosswise base guide for causing a centerline in a conveyance direction of the base to coincide with a centerline in the conveyance direction of the apparatus, a base position detecting sensor for causing the crosswise base guide to start its operation and base breadth detecting sensors for causing the crosswise base guide to stop its operation. The apparatus may further comprise base guide moving mechanism for causing a centerline of the crosswise base guide to coincide with the centerline of the thin film.

9 Claims, 5 Drawing Sheets

APPARATUS FOR CONVEYING BASE

This is a continuation of application Ser. No. 921,513 filed Oct. 22, 1986, now abandoned.

BACKGROUND OF THE INVENTION

This invention relates to an apparatus for conveying a base and more particularly to a technique effectively applicable to an apparatus for conveying a base for use in a film laminator.

Printed circuit boards for use in electronic equipment e.g., computers are such that a copper wiring or the like having a predetermined pattern is formed on the surface of an insulating base.

A printed circuit board of that sort is made in the following steps of process. A laminate consisting of a photosensitive resin layer (photoresist) and a translucent resin film (protective film) for protecting the photosensititive resin layer is bonded onto a conductive layer provided on an insulating base through thermocompresson bonding. The thermocompression bonding of laminates is conducted by a laminator on a mass-production basis. Then a wiring pattern film is superposed on the laminate, and the photosensitive resin layer is exposed to light for a predetermined period of time through the wiring pattern film and the translucent resin film. The photosensitive resin layer thus exposed to light is developed to form an etching mask pattern after the translucent resin film is peeled off by a peeling device. Unnecessary portions of the conductive layer are subsequently removed by etching and the remaining photosensitive resin layer is also removed to form a printed circuit board having a predetermined wiring pattern.

During the process of manufacturing the printed circuit board, there is needless to say required the step of forming a laminate consisting of a photosensitive resin layer and a translucent resin film on an insulating base having conductive layers formed on both sides thereof through thermocompression bonding.

A roll of laminate continuously wound on a supply roller of a film laminator is pulled out and then cut into pieces corresponding in dimensions to the base to provide a laminate to be bonded thereto.

An apparatus for conveying the base to the thermocompresson roller position is equipped with a plurality of rotary means formed with a plurality of discoidal rollers (pinch rollers), which are rotated to move the base. When the base approaches thermocompression rollers, fixed guide members guide the base crosswise toward the centerline in the conveyance direction and cause the thermocompression rollers to hold the base therebetween.

However, the problem is that, when a thin base that has been bent crosswise is conveyed, the guide members are incapable of setting the centerline of the base accurately to the centerline in the conveyance direction of the apparatus for conveying a base.

Also, even if the base is set exactly along the centerline of the conveyance path, there is still a fear that the set position of the base would be offset from a thin film to be laminated thereon. In this case, it would be very difficult to correct the offset amount therebetween.

The above-described and other problems to be solved by the present invention and novel features thereof will become manifest upon making reference to the detailed description which follows and the accompanying drawings.

SUMMARY OF THE INVENTION

A typical embodiment of the present invention disclosed hereby will briefly be outlined as follows:

In other words, the present invention is concerned with an apparatus for conveying a base by means of conveyor rollers and presser rollers and comprises a crosswise base guide means for making a centerline in a conveyance direction of the base coincide with a centerline in the conveyance direction of the apparatus for conveying a base (revision of the course), a base position detection sensor means for making the crosswise base guide start its operation, and base breadth detecting sensor means for making the crosswise base guide stop its operation.

A base on the conveyor rollers is conveyed by driving the conveyor rollers while it is held by the presser rollers. When the base is conveyed, the base position detecting sensor detects the base being conveyed and products a detection signal for making the crosswise base guide members of the crosswise base guide (revision of the course) start its operation. The base breadth detecting sensor attached to the crosswise base guide detects both ends of the base and produces a detection signal for making the crosswise base guide members of the crosswise base guide stop operation. The base can thus be conveyed up to the thermocompression rollers without being bent in such a state that the centerline in the conveyance direction of the base coincides with the centerline in the conveyance direction of the apparatus for conveying a base.

Furthermore, according to the present invention, there is provided an apparatus for conveying a base by means of conveyor rollers and presser rollers, comprising a crosswise base guide means for aligning a centerline of the base with a centerline in a conveyance direction of the apparatus while the base is being conveyed and a base guide moving means for making a centerline of the crosswise base guide means coincide with centerline of a thin film.

Referring now to the drawings, a description will be given of an embodiment of the present invention applied to an apparatus for conveying a base for a film laminator for bonding a laminate consisting of a photosensitive resin layer and a translucent resin film onto a printed circuit board through thermocompression bonding.

DETAILED DESCRIPTION OF THE PREFERRED EMBODIMENTS

Figure 1:
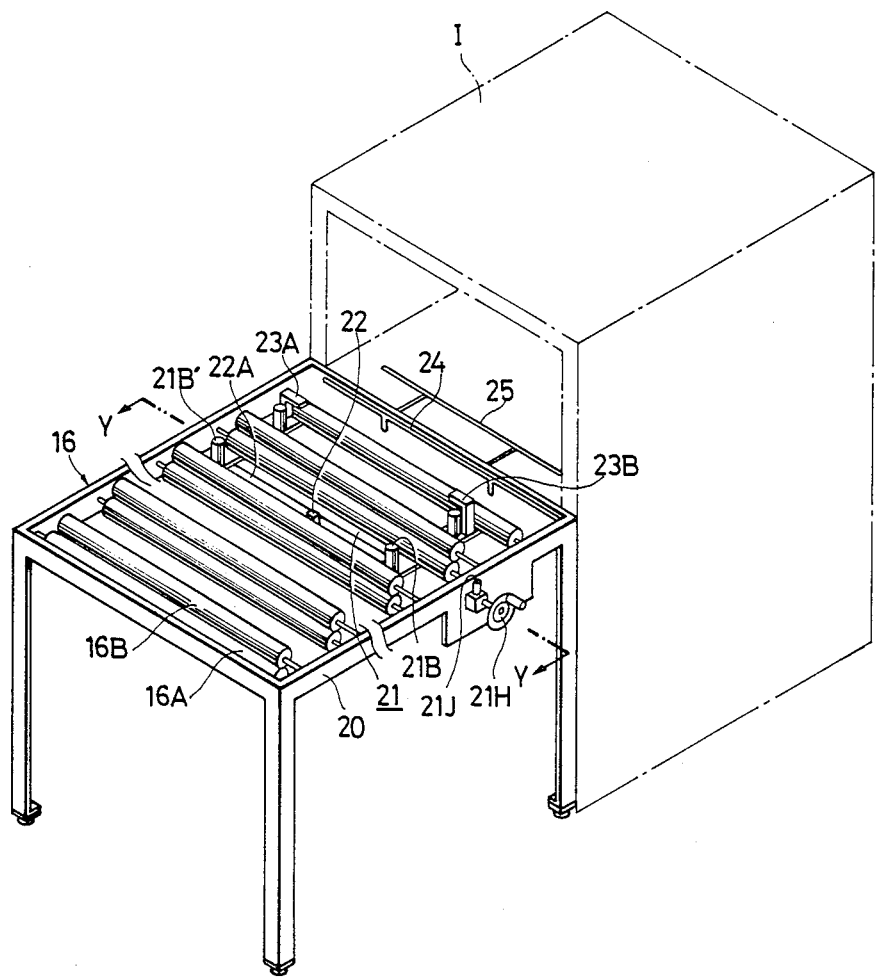
FIG. 1 is a perspective structural view of an apparatus for conveying a base according to the present intention.

In all drawings of the embodiment of the present invention, like reference characters designate like elements performing the like function respectively and the description thereof will be omitted.

Figure 2:
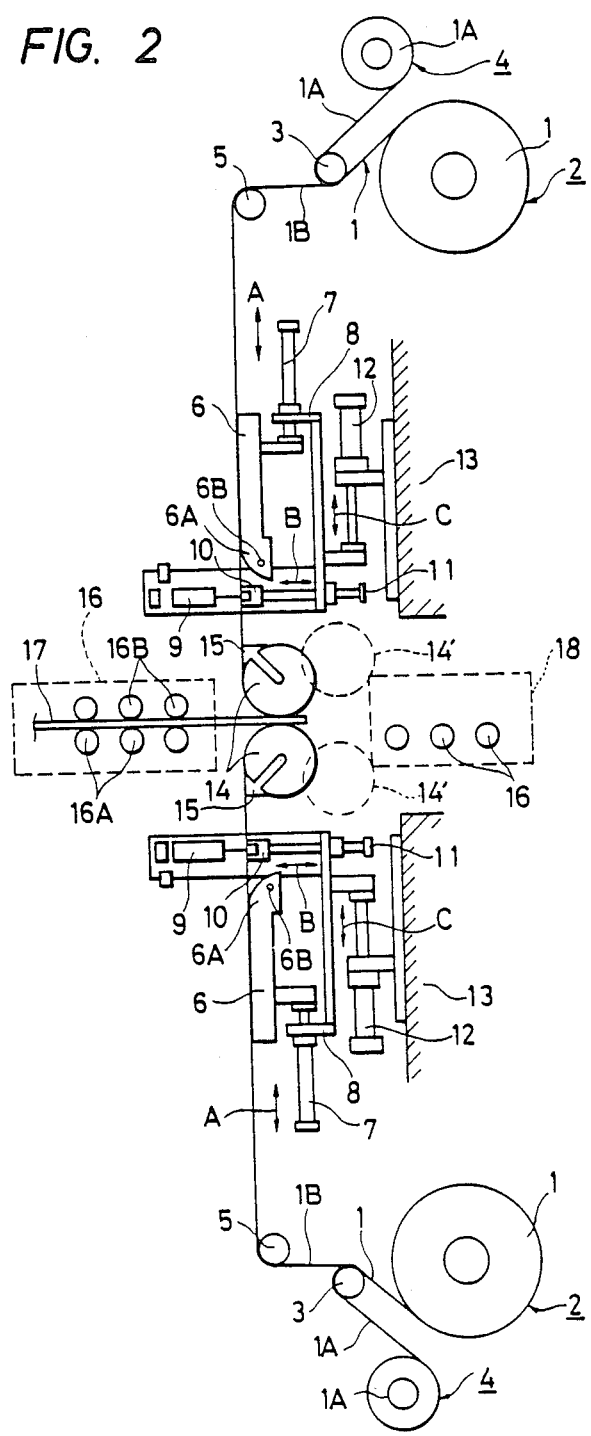
FIG. 2 is a copy structural view of a film laminator related to the apparatus for conveying a base according to the present invention.

FIG. 2 is a schematic structural view of a film laminator employing an apparatus for conveying a base embodying the present invention.

In a film laminator shown in FIG. 2, a three-layer laminate 1 consisting of a photosensitive resin layer and a translucent resin film is continuously wound on each supply roller 2. The laminate 1 wound on the supply roller 2 is separated by a peeling roller 3 into a translucent resin film (protective film) 1A and a laminate 1B composed of the photosensitive resin layer with one side exposed (adhesive surface) and the translucent resin film. The translucent resin film 1A thus separated is so arranged as to be rolled around a take-up roller 4.

The front end of the laminate 1B in the supply direction is absorbed by a main vacuum plate 6 through a tension roller 5 providing proper tension. The main vacuum plate 6 is supported by a frame 8 through an air cylinder 7 whose position is variable in the direction of an arrow A. The main vacuum plate 6, together with the tension roller 5, is used to supply the laminate 1B to a base 17 without causing wrinkles thereto.

An arcuate portion 6A at the front end of the main vacuum plate 6 contains a heater 6B and bonds the front end of the laminate 1B onto the conductive layer of the base 17 through thermocompression bonding.

A rotary cutter 9 installed close to the arcuate portion 6A is used to cut the continuous laminate 1B into a piece corresponding in dimensions to the base 17.

A subvacuum plate 10 for having the front end of the laminate 1B thus cut off absorbed by the arcuate portion 6A is positioned opposite to the rotary cutter 9. The subvacuum plate 10 is supported by the frame 8 through an air cylinder 11 whose position is variable in the direction of an arrow B.

The frame 8 for supporting the main vacuum plate 6 and the subvacuum plate 10 is supported by a frame of the apparatus proper through an air cylinder 12 whose position is variable in the direction of an arrow C.

The laminate 1B whose front end is bonded by the arcuate portion 6A onto the conductive layer of the base 17 through thermocompression bonding is thoroughly bonded by a thermocompression roller 14. The thermocompression roller 14 tentatively bonds the front end of the laminate 1B onto the arcuate portion 6A through thermocompression bonding and then moves from a position shown by a dotted line marked with numeral 14' of FIG. 2 to what is shown by a solid line.

The rear end of the laminate 1B cut to size by the rotary cutter 9 is guided by a traingular rotary vacuum plate 15 in such a manner as to prevent it from wrinkling and being bonded by the thermocompression roller 14 through thermocompression bonding.

The film laminator thus constructed works to bond the laminate 1B on the base 17 supplied with the conductive layer on both sides (or one side) of the insulating base conveyed by the apparatus 16 for conveying a base comprising the conveyor rollers 16A and the presser rollers 16B. The laminate 1B is bonded onto the base 17 through thermocompression bonding so that the adhesive surface of the photosensitive resion layer whose the translucent resin film 1A has been peeled off may stick to the surface of the conductive layer. The base 17 with the laminate 1B bonded thereto through thermocompression bonding is carried out of the apparatus 18 by a base discharging device.

FIG. 1 is a schematic structural view of the above apparatus 16 for conveying a base.

As shown in FIG. 1, the apparatus for conveying a base is coupled to the film laminator 1. Each conveyor roller 16A is formed with a (solid or hollow: preferably hollow) fiber-reinformed plastic columnar member and a plurality of conveyor rollers 16A are rotatably fitted to the frame 20 of the apparatus 16 proper. The plurality of conveyor rollers 16A are arranged a predetermined space apart to prevent the thin base 17 from drooping. Moreover, only every other one out of those conveyor rollers 16A is coupled to a driving source (not shown). Every two of the conveyor rollers 16A or all of them may be coupled to the driving source as occasion demands.

The base 17 is mounted on the conveyor rollers 16A and conveyed while held by the presser rollers 16B. When a thin base is conveyed, warping and waving are remedied. Like the conveyor roller 16A, each presser roller 16B, which is rotatably fitted to a frame 20, is also formed with a columnar member to keep the end of the base 17 from being caught by the rotary means built of a discoidal member and stopped when the base 17 is thin enough to readily warp and wave. Although the presser rollers 16B are not coupled to the driving source, they may also be coupled thereto. When a base 17 which is not thin and tends to less warp and wave is used, the presser rollers 16B may be rotary means prepared by splitting a plurality of discoidal members.

Figure 3:
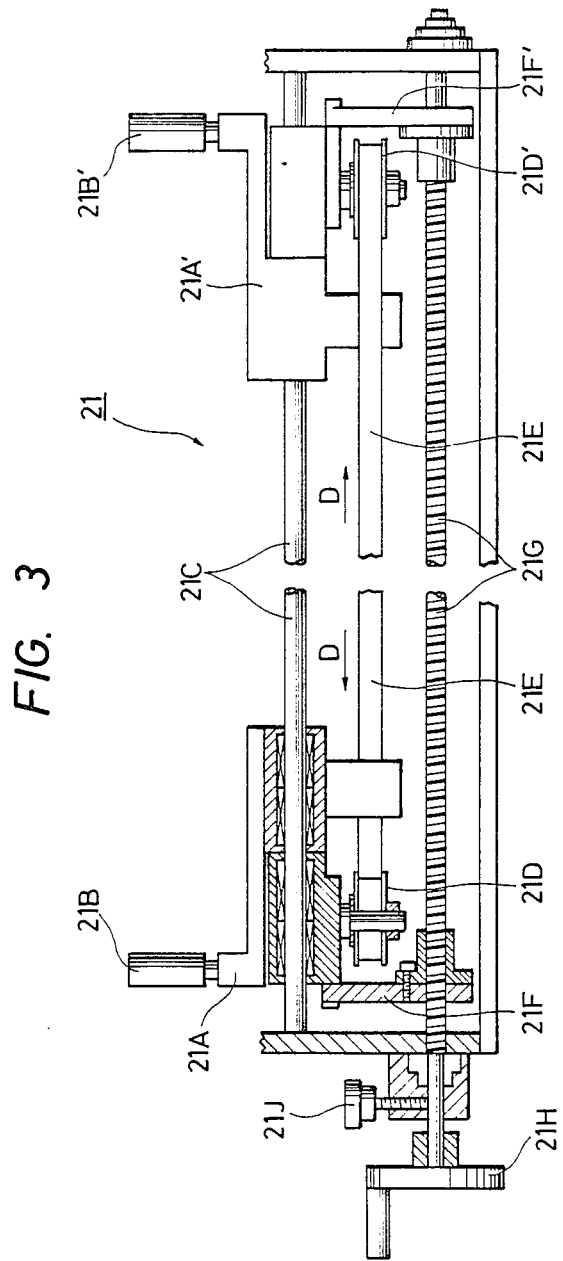
FIG. 3 is a sectional view taken on line Y—Y of FIG. 1.
Figure 4:
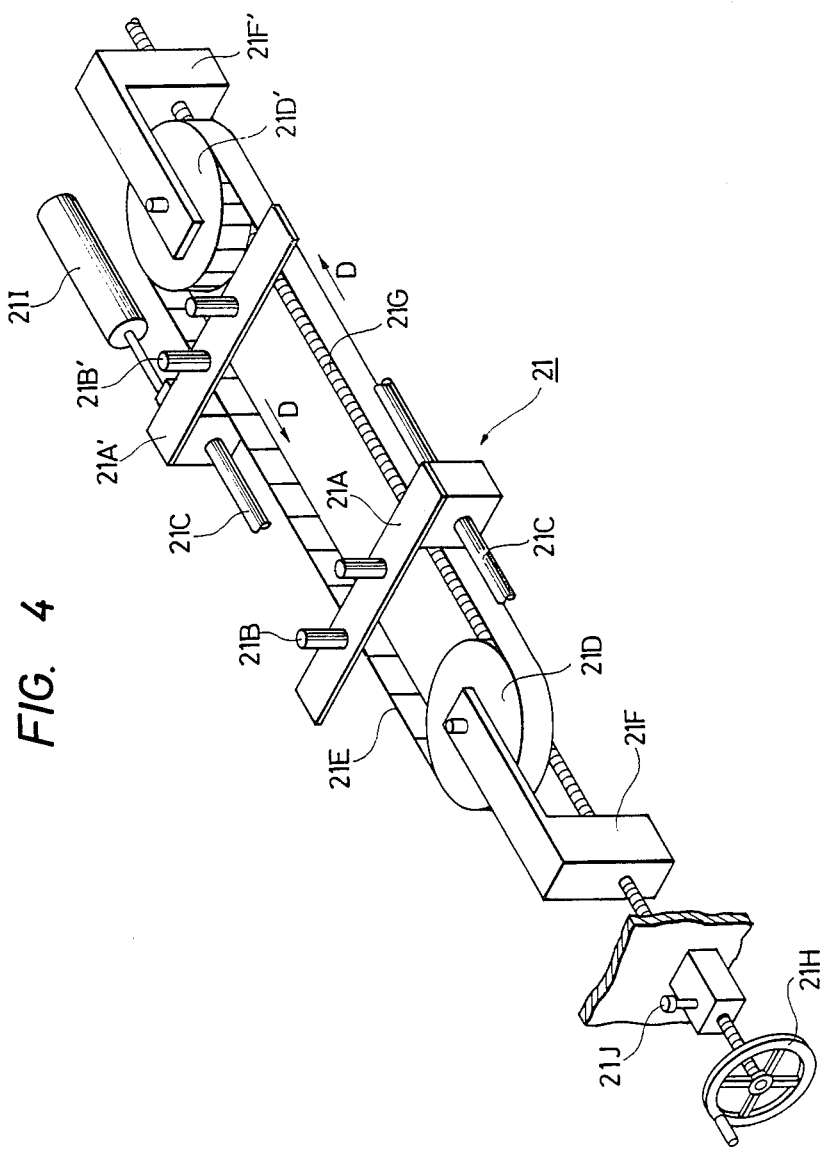
FIG. 4 is a perspective structural view of the crosswise base guide of FIG. 3.

A crosswise base guide 21 is intended to make the centerline in the conveyance direction and the centerline in the conveyance direction of the base 17. As shown in FIG. 3 (sectional view taken on line Y—Y) and FIG. 4 (perspective view), the crosswise base guide 21 is formed of crosswise base guide members 21B, 21B' supported by support members 21A, 21A'. The support members 21A, 21A' are slidably fitted to a support rod 21C. The support members 21A, 21A' are also fitted to an endless belt 21E wound on pulleys 21D, 21D' in such a manner that they are moved close to each other when the endless belt 21E moves in the direction of an arrow D. The support members 21A, 21A' are caused to slide by an air cylinder 21I installed on the support member 21A'. The pulleys 21D, 21D' are supported by inverted L-shaped support members 21F, 21F', respectively. The inverted L-shaped support members 21F, 21F' mate with a threaded rod 21G, which is equipped with a handle 21H and, by turning the handle 21H, the inverted L-shaped support members 21F, 21F' are transversely moved while a fixed distance is held by them therebetween. The moving mechanism (fine adjustment mechanism) is intended to adjust the position of the crosswise base guide 21 to make the centerline in the conveyance direction of the base 17 coincide with the centerline in the conveyance direction of the laminate 1B for thermocompression bonding, i.e., the centerline of the apparatus 16 for conveying a base in case the former shifts from the latter. The position of the crosswise base guide 21 is fixed with a screw 21J for fixing the rotation of the threaded rod 21G.

A base position detecting sensor 22 for detecting the front (or rear) end of the base 17 produces a signal for starting driving the crosswise base guide members 21B, 21B' of the crosswise base guide 21. The base position detecting sensor 22 is fitted to the frame 20 through a support frame 22A. A reflective optical sensor is, for instance, employed as the base position detecting sensor 22.

Base breadth detecting sensors 23A, 23B for respectively detecting both ends of the base 17 produce signals for stopping driving the crosswise base guide members 21B, 21B' of the crosswise base guide 21. The base breadth detecting sensors 23A, 23B are installed on the inner sides of the crosswise base guide members 21B, 21B' close to the front end of the conveyance direction of the support members 21A, 21A'. In other words, the base breadth detecting sensors 23A, 23B are installed in such a position as to stop the crosswise base guide members 21B, 21B' when the centerline of the base coincides with the centerline of the apparatus for conveying a base. The control of the crosswise base guide 21 can simply be materialized by causing the signal for stopping driving the crosswise base guide members 21B, 21B' to be produced slightly later than the time both ends of the base 17 are detected by the base breadth detecting sensors 23A, 23B using a delay circuit. As the base breadth detecting sensors 23A, 23B, translucent type optical sensors are used.

The base 17 can thus be conveyed to the starting position of thermocompression bonding readily and accurately in such a state that the centerline in the conveyance direction of the base 17 is made to coincide with the centerline in the conveyance direction of the apparatus for conveying a base without allowing the base 17 to bend by installing the crosswise base guide 21 for making the centerline in the conveyance direction of the base 17 coincide with the centerline in the conveyance direction of the apparatus for conveying a base, the base position detecting sensor 22 for starting the operation of the crosswise base guide 21 and the base breadth detecting sensors 23A, 23B for stopping the operation of the crosswise base guide 21.

Figure 5:
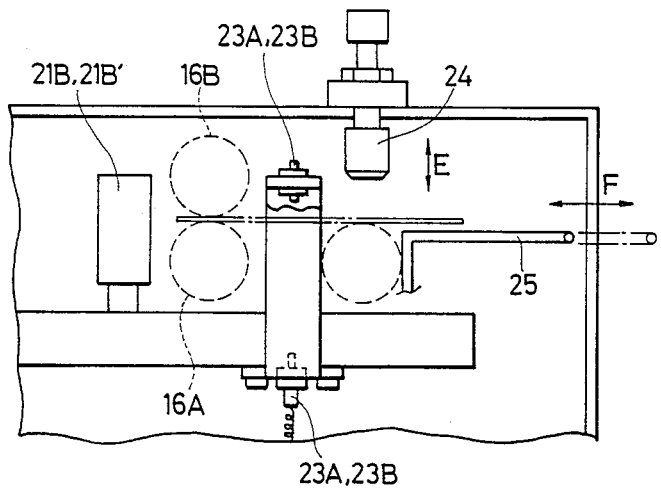
FIG. 5 is a side view showing the construction of the base breadth detecting sensors, the holding member and the base support member shown in FIG. 1.
Figure 6:
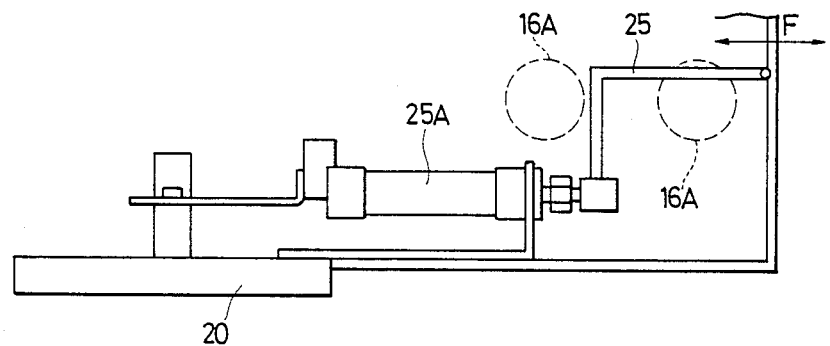
FIG. 6 is a side view showing the construction of the base support member of FIG. 1.

A base holding member 24 shown in FIG. 1 fixes and holds the base 17 so that it may not drop when the base 17 reaches the starting position of the thermocompression bonding. As shown in FIG. 5 (side view), the base holding member 24 is fitted to the frame 20 and moved by an air cylinder and a spring (not shown) in the direction of an arrow E. Moreover, a base support member projects in the direction of an arrow F interlockingly or not interlockingly with the operation of driving the base holding member 24. The control of the base support member 25 in the direction of the arrow E is conducted by an air cylinder 25A fitted to the frame 20. The operation of the base holding member 24 or base support member 25 is controlled by the signal (not shown) for starting or stopping driving the base position detecting sensor.

The base holding member 24 and the base support member 25 thus installed support the base 17 to prevent the base 17 from dropping when it reaches the starting position of the thermocompression bonding and are capable of holding it in position until the thermocompression rollers vertically sandwich it therebetween, so that the laminate 1B is accurately bonded onto the base 17 through thermocompression bonding.

Incidentlly, the following modification is possible according to the present invention. Namely, in order to automatically control the base crosswise guide moving means for causing the centerline of the base crosswise guide means to coincide with the centerline of a thin film to be laminated on the base, thin film breadth detecting sensors (not shown) for detecting the breadth of the laminate thin film are provided at a predetermined position in each of the upper and lower laminate thin film supply paths. The detection signals of these sensors and the above-described base width detecting sensors 23A, 23B are inputted into a well known controller (not shown) whereby upper and lower laminate thin films are positioned in alignment with each other in accordance with the control signals (soft ware). Also, by controlling the base crosswise guide moving means, the centerline of the base crosswise guide is made to coincide with the centerline of the thin film.

The operation of the apparatus for conveying a base according to the present invention will briefly be described.

In FIG. 1, the base 17 is conveyed toward the thermocompression rollers 14 by driving the given number of conveyor rollers 16A among the plurality of them. When the front end of the base 17 thus conveyed is detected by the base position detecting sensor 22, the crosswise base guide 21 starts operating according to the drive-starting signal. The crosswise base guide 21 operates so as to make the centerline of the base 17 coincide with the centerline of the apparatus for conveying a base using the crosswise base guide members 21B, 21B'. When both ends of the base 17 are then detected by the base breadth detecting sensors 23A, 23B, the operation of the crosswise base guide 21 is stopped by the drive-stopping signal. The base 17 is consequently conveyed to the position of thermocompression bonding in such a state that the centerline in the conveyance direction of the base 17 coincides with the centerline in the conveyance direction of the apparatus for conveying a base. At this time, the conveyor rollers 16A are stopped by the base position detecting sensor (not shown) and the holding member 24 moves down and makes the base immovable. The base support member 25 simultaneously projects to support and prevent the base 17 from dropping. Then as shown in FIG. 2, the thermocompression rollers 14 move to the base 17 on the left and sandwich the base 17 through the laminate 1B thermocompression bonded. The thermocompression rollers 14 and the conveyor rollers 16A are driven so that the laminate 1B is bonded onto the laminate 1B through thermocompression bonding.

Although the present invention has been described in its preferred form with a certain degree of particularity, it is needless to say understood that the invention is not limited to the specific embodiments thereof and modification of the invention is possible within its spirit and scope as set out in the accompanying claims.

For example, only one of the crosswise base guide and the crosswise base guide members may be made to move though it has been so arranged as to move both of them in the above embodiment. Accordingly, only one side of the base in the crosswise direction may be detected.

In the foregoing embodiment, in order to correct the positional offset between the base and the thin films to be laminated thereon by means of the base widthwise guide moving mechanism, the set positions of the upper and lower thin films to be laminated are detected for automation. However, one of the set positions of the upper and lower laminate thin films may be held satationary, and the other is held movable to thereby detect only the movable position of the thin film.

Furthermore, the present invention is applicable to an apparatus for conveying a base for use in a flim laminator.

As set forth above, the apparatus for conveying a base comprises the crosswise base guide for making the centerline in the conveyance direction of the base coincide with the centerline in the conveyance direction of the apparatus for conveying the base, a board position detecting sensor for making the crosswise base guide start operation, and base breadth detecting sensors for making the crosswise base guide stop operation, so that the base is conveyable to the starting position of thermocompression bonding in such a state as to make the centerline in the conveyance direction of the base coincide with the centerline in the conveyance direction of the apparatus for conveying a base without causing the base to bend.

We claim:

1. An apparatus for conveying a base from an input position to a holding position, comprising:

conveying means comprising a plurality of pairs of conveying and pressing rollers for transporting said base toward said holding position;

a crosswise base guide disposed in a path of said base along said conveying means between said input position and said holding position for aligning a centerline of said base with a centerline of said apparatus as said base is being transported by said conveying means, said base guide comprising a threaded rod extending generally perpendicular to a conveying direction of said base and lying in a plane generally parallel to a plane of said base, first and second pulley support members threadedly engaged with said threaded rod to move together in the same direction perpendicular to said conveying direction when said rod is rotated, a pulley rotatably mounted on each of said pulley support members, an endless belt entrained between said pulleys, a support rod mounted generally parallel to said threaded rod, a pair of guide member supports slidably mounted on said support rod and connected on opposite sides to said endless belt so that said guide member supports move toward or away from one another as said endless belt is moved, a pair of guide members mounted on respective ones of said guide member supports and disposed in a said path of said base, and means connected to one of said guide members for moving both said guide members through said endless belt;

base position detecting means for detecting a presence of a base and instructing said moving means to start moving said guide members; and base breadth detecting means for detecting a breadth of said base and stopping said moving means when said guide members are positioned apart from one another by a distance corresponding to a breadth of said base.

2. The base conveying apparatus of claim 1, wherein said base position detecting means is disposed at a position upstream of said base breadth detecting means in a conveying direction of said base.

3. The base conveying apparatus of claim 1, wherein said base position detecting means is disposed to detect at least one of a leading edge and trailing edge of said base.

4. The base conveying apparatus of claim 1, wherein said base breadth detecting means is disposed to detect side edges of said base.

5. The base conveying apparatus of claim 1, further comprising a base holding member and a base supporting member for fixing said base in position at said holding position, said base holding member being mounted above said base at said holding position and being movable perpendicular to a plane of said base, and said base supporting member being movable in a direction parallel to said plane of said base and supporting said base from below.

6. The base conveying apparatus of claim 5, further comprising an air cylinder connected to one of said guide member supports for moving both said guide member supports through movement of said endless belt.

7. The base conveying apparatus of claim 5, wherein said base holding member and said base supporting member operate independently of one another.

8. The base conveying apparatus of claim 5, wherein said base holding member and said base supporting member operate in cooperation with one another.

9. The base conveying apparatus of claim 5, wherein said base holding member and said base supporting member are retracted after said base has reached said holding position.

* * * * *